(12) United States Patent
Freitas (10) Patent No.: US 7,602,249 B2
(45) Date of Patent: Oct. 13, 2009

(54) AMPLIFIER ELECTRONIC CIRCUIT COMPRISING A DIFFERENTIAL PAIR AND A FEEDBACK SYSTEM

(75) Inventor: Philippe Freitas, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 20 days.

(21) Appl. No.: 12/056,069

(22) Filed: Mar. 26, 2008

(65) Prior Publication Data
US 2008/0238549 A1    Oct. 2, 2008

(30) Foreign Application Priority Data
Mar. 27, 2007    (FR)    .................................. 07 54069

(51) Int. Cl.
*H03F 3/45* (2006.01)
(52) U.S. Cl. ...................................... 330/259; 330/261
(58) Field of Classification Search ................. 330/259, 330/257, 261, 258, 260
See application file for complete search history.

(56) References Cited

U.S. PATENT DOCUMENTS

| 4,308,504 | A | * | 12/1981 | Ida ............................. 330/253 |
| 4,794,349 | A | * | 12/1988 | Senderowicz et al. ....... 330/253 |
| 6,023,196 | A | * | 2/2000 | Ashby et al. ................. 330/290 |
| 6,580,324 | B2 | * | 6/2003 | Palaskas et al. ............. 330/258 |
| 6,664,912 | B1 | | 12/2003 | Zanchi |
| 7,088,181 | B1 | * | 8/2006 | Voo ............................. 330/258 |
| 2002/0149427 | A1 | | 10/2002 | Schrodinger et al. |

OTHER PUBLICATIONS

French Official Search Report in French, Nov. 8, 2007.
Yin, et al., "A 16-b 320-kHz CMOS A/D Converter Using Two-Stage third-Order ΣΔ Noise Shaping", IEEE Journal of Solid-State Circuits Jun. 28, 1993, No. 6.
Karanicolas, et al., "A High-Frequency Fully Differential BiCMOS Operational Amplifier", IEEE Journal of Solid-State Circuits Mar. 26, 1991, No. 3.
Chatterjee et al., "A 0.5-V Bulk-Input Fully Differential Operational Transconductance Amplifier", IEEE, 2004.

* cited by examiner

*Primary Examiner*—Henry K Choe
(74) *Attorney, Agent, or Firm*—Brinks Hofer Gilson & Lione (57) ABSTRACT

An amplifier electronic circuit with at least one amplifier stage, including a differential pair that includes two input transistors controlled by respective input signals and means for measuring the common mode output voltage of the amplifier, includes at least one first electronic component and one second electronic component, each electronic component comprising a first gate and a second gate, a source and a drain, the first gates of the first and second electronic components being interconnected and connected to the drain of the first electronic component, one of the second gates of the electronic component receiving the measured common mode output voltage, the other of the second gates receiving a reference voltage. The amplifier electronic circuit may be used in applications using differential pairs, for example, an amplifier, an oscillator, or active filters.

14 Claims, 6 Drawing Sheets

Fig. 8

AMPLIFIER ELECTRONIC CIRCUIT COMPRISING A DIFFERENTIAL PAIR AND A FEEDBACK SYSTEM

PRIORITY CLAIM

This application claims priority to French Patent Application No. 0754069, filed Mar. 27, 2007.

TECHNICAL FIELD

The present invention concerns an amplifier electronic circuit including a differential pair.

BACKGROUND

As is known, a differential pair is formed of two identical transistors biased by the same current source or different current sources.

The differential pair is the active portion of a differential amplifier, for example.

The object of the differential pair is to amplify the difference between two input signals of the differential pair.

The output voltages of the amplifier therefore consist in practice of a differential mode voltage portion and a common mode voltage portion.

The differential mode output voltage corresponds to the difference between the input signals amplified by the differential gain and the common mode output voltage corresponds to half the sum of the output signals or in other words to the average of the output signals.

To avoid output saturation problems and to obtain as linear of an amplification as possible, it is preferable for the common mode voltage to remain close to a predefined value.

One parameter representative of the quality of a differential amplifier is the common mode rejection ratio (CMRR), and corresponds to the ratio between the differential mode gain and the common mode gain. The CMRR parameter is maximized when the common mode gain is minimized.

Moreover, the common mode output voltage is subjected to variations depending on variations of other parameters of the circuit.

Any variation in the dimensions of the transistors of the differential pair during its fabrication can cause an imbalance between the branches of the differential amplifier, causing variations in the common mode output voltage.

Other external factors, for example, temperature, can affect the transistors of the differential pair and the remainder of the amplifier circuit differently, causing variations in the common mode output voltage.

Variations in the common mode output voltage interfere with the performance of the differential amplifier, in particular the differential mode gain and the excursion of the output signals.

It is therefore necessary not only to control the value of the common mode output voltage but also to reduce the dependence of the value of that voltage on variations of other parameters of the circuit.

Techniques have therefore been proposed aiming to control the value of the common mode output voltage of these amplifiers.

One known technique includes extracting the common mode output voltage in order then to compare the extracted voltage and a reference voltage, and finally amplifying the signal resulting from this comparison. This amplified error signal is then fed back into the differential pair via its bias components.

This technique provides good control of the common mode voltage, but implementing it uses up silicon die area and increases the current consumption, which is caused by adding additional components dedicated to extracting the common mode voltage, comparing that voltage with a reference voltage, and amplifying the error signal.

A second technique includes extracting information on the common mode input voltage and injecting it appropriately into the circuit in order to compensate for the impact of its variations on the common mode output voltage.

This technique also necessitates the addition of components. Furthermore, its current consumption is high even though it does not have the accuracy of the first technique. Effectively it just compensates for the impact of the variations of the input signal on the common mode output voltage, rather than controlling the common mode output voltage.

The IEEE document "A 0.5 V Bulk-Input fully differential operational transconductance amplifier" (Shouri Chatterjee, Yannis Tsividis and Peter Kinget, Department of Electrical Engineering, Columbia University, New York, USA) describes a technique for feeding the common mode output voltage back into the bias components. This technique is also less accurate than the first technique, as the common mode output voltage is not compared to a reference voltage.

SUMMARY

The present invention is generally concerned with an electronic circuit including a differential pair and a feedback system controlling the common mode output voltage of an amplifier.

It is more particularly concerned with the design of an amplifier electronic circuit including a differential pair at the input receiving two differential input signals and providing at the output two differential output signals and including a feedback system controlling the common mode output voltage.

An aim of the present invention is to resolve at least some of the drawbacks referred to above and to propose an electronic circuit including an accurate system for controlling the common mode output voltage of an amplifier including a completely differential pair at the input, without sacrificing much silicon die area and without increasing current consumption.

To this end, the invention relates to an amplifier electronic circuit comprising at least one amplifier stage, the first amplifier stage comprising a differential pair comprising two input transistors controlled by respective input signals; means for measuring the common mode output voltage of the amplifier; and at least one first electronic component and one second electronic component, each electronic component comprising a first gate and a second gate, a source and a drain, the first gates of the first and second electronic components being interconnected and connected to the drain of the first electronic component thereby forming a current mirror configuration, one of the second gates of the first and second electronic components receiving the measured common mode output voltage, the other of the second gates receiving a reference voltage, a reference current flowing through the first electronic component, the second electronic component being adapted to bias some or all of said amplifier stages.

The characteristics of the "pseudo" current mirror circuit are thus exploited to achieve a common mode feedback circuit of relatively compact design. The common mode output voltage of the amplifier is therefore controlled (both as to its value and as to variations in it) and adapted to the reference voltage, thanks to the current self-balancing of the current mirror.

In one embodiment the second electronic component is connected to the common source of the transistors of the differential pair.

In another embodiment the amplifier comprises a third electronic component, the first and second gates of the third electronic component being connected to the first and second gates of the second electronic component, respectively, the second and third electronic components being each connected to one of the transistors of the differential pair.

Few electronic components are added to the differential pair and consequently the necessary silicon die area is small, as explained hereinafter.

For example, in the amplifier electronic circuit, the measured common mode output voltage is applied to the second gate of the second electronic component and the reference voltage is applied to the second gate of the first electronic component.

The common mode output voltage is extracted at the terminals of the transistors of the differential pair, for example.

In a different embodiment the number of amplifier stages of the difference of the two input signals applied to the transistors of the differential pair is odd and the common mode output voltage is extracted from the last amplifier stage.

Alternatively, in the amplifier electronic circuit, the measured common mode output voltage is applied to the second gate of the first electronic component and the reference voltage is applied to the second gate of the second electronic component.

The differential pair belongs to a first amplifier stage of the difference of the two input signals applied to the transistors of the differential pair and the amplifier electronic circuit comprises a second amplifier stage of that difference, the measured common mode output voltage being extracted from the terminals of the transistors of the second amplifier stage.

In a different embodiment the number of amplifier stages of the difference of the two input signals applied to the transistors of the differential pair is even and the common mode output voltage is extracted from the last amplifier stage.

In one possible embodiment one of the electronic components comprises two single-gate transistors connected in parallel.

Thus these transistors "share" their source and their drain, i.e., the sources of the transistors of the electronic component are connected to each other and the drains of those same transistors are connected to each other.

Alternatively, one of the electronic components comprises a double-gate transistor having two gates.

In particular, a double-gate transistor is one such transistor.

Multiple-gate transistors (known as multigate transistors) have better characteristics than conventional single-gate transistors, reducing the known "short-channel" effect, caused by the reduction of the dimensions of components, to which technological advances are tending.

Also, this type of transistor provides a further saving in terms of silicon die area.

One of the electronic components advantageously comprises a FinFET or planar type double-gate transistor. This type of transistor is therefore particularly suitable here.

In one embodiment the means for measuring the common mode output voltage of the differential pair comprise two resistors placed in series between two outputs of the amplifier delivering the output signals.

Alternatively, the means for measuring the common node output voltage comprise capacitors and switches.

BRIEF DESCRIPTION OF THE DRAWINGS

Other features and advantages of the invention will become more apparent in the course of the following description, given with reference to the appended drawings, provided by way of nonlimiting example, in which.

DETAILED DESCRIPTION

A first embodiment of an amplifier of the invention comprising a differential pair 1 with common mode output voltage feedback is described with reference to FIG. 1.

The differential pair 1 comprises two transistors 1a, 1b coupled together at a common source 11. Here the two transistors 1a, 1b are N-channel metal oxide semiconductor (MOS) transistors.

The input voltage signals ve1, ve2 are applied to the gates of the transistors 1a, 1b of the differential pair 1. The first voltage signal ve1 is applied to the gate of the first transistor 1a of the differential pair 1 and the second voltage signal ve2 is applied to the gate of the second transistor 1b of the differential pair 1.

The first output signal vs1 of the amplifier is the voltage at the drain 10a of the first transistor 1a of the differential pair 1 and the second output signal vs2 of the amplifier is the voltage at the drain 10b of the second transistor 1b of the differential pair 1.

The differential pair 1 is biased via the common source 11 (foot bias circuit 3) and via each of the drains 10a, 10b of the differential pair 1 (head bias circuit 2).

The head bias circuit 2 is a current mirror producing two copies I1, I2 of an input current Ip. This current mirror 2 therefore comprises three P-channel MOS transistors 2a, 2b, 2c which have identical dimensions in this example. The sources of the transistors 2a, 2b, 2c are connected to a supply voltage Vdd, which is a positive voltage in this example. The first transistor 2c, configured as a diode, has the input current Ip flowing through it. The second transistor 2a and the third transistor 2b bias the differential pair 1 via the drains 10a, 10b of the transistors 1a, 1b. The currents I1, I2 that flow through the second and third transistors 2a, 2b are a copy of (i.e., identical to) the input current Ip flowing through the first transistor 2c.

In this embodiment, the foot bias circuit 3 of the differential pair 1 is provided by two electronic components 3a, 3b. Each electronic component 3a, 3b consists of two transistors in parallel, e.g., N-channel MOS transistors.

The first component 3a comprises two transistors M1a, M2a connected in parallel. Their common sources s3a are connected to ground gnd. Their common drains d3a are connected to the gate g1a of the first transistor M1a. A reference voltage vctrl is applied to the gate g2a of the second transistor M2a. The two transistors M1a and M2a are connected by their drains to a current source S1 delivering a reference current Ie.

The second component 3b also comprises two transistors M1b, M2b connected in parallel. Their common sources s3b are also connected to ground gnd. Their common drains d3b are connected to the common source 11 of the differential pair 1. The gate g2b of the second transistor M2b receives the common mode output voltage vcom of the amplifier. The total current coming from the transistors of the differential pair 1a, 1b and splitting between the transistors M1b, M2b of the second component is referred to as the current Is hereinafter.

The first transistor M1a of the first component 3a and the first transistor M1b of the second component 3b are connected in a current mirror configuration. In other words, the gate g1a of the first transistor M1a of the first component 3a is connected to the gate g1b of the first transistor M1b of the second component 3b and to the common drains d3a of the two transistors M1a, M2a of the first component 3a.

The current flowing through the first transistor M1b of the second component 3b is therefore a copy of the current flowing through the first transistor M1a of the first component 3a.

The foot bias circuit 3 of the differential pair 1 is generally provided by a current source delivering a predefined fixed current. In contrast, in this embodiment of the present invention, the current flowing through the second electronic component 3b of the foot bias circuit is variable in order to be able to adjust the common mode output voltage as described hereinafter.

In one embodiment of the invention, the common mode output voltage vcom is extracted by means of two resistors R1, R2. Each of the resistors R1, R2 is connected by a first end r1a, r2a to each of the outputs of the amplifier, i.e. to each of the drains 10a, 10b of the transistors 1a, 1b of the differential pair 1 in this example. Finally, the resistors R1, R2 are interconnected at their second ends r1b, r2b.

The two resistors R1, R2 are of identical value.

The common mode output voltage vcom is therefore measured at the common end r1b, r2b of the two resistors R1, R2.

In this embodiment, the common mode output voltage feedback is effected via the foot bias circuit 3 of the differential pair 1. The feedback is effected at the level of the second component 3b of the foot bias circuit 3, in particular, at its gate g2b.

The reference voltage vctrl applied to the transistor M2a is obtained from a reference voltage generator circuit, for example. This kind of generator can simply comprise an MOS transistor configured as a diode and a series resistor between ground and the supply voltage Vdd, for example.

The operation of the two components 3a, 3b connected as a "pseudo" current mirror, i.e., partly connected in a current mirror configuration, as explained hereinabove, is described next.

If the common mode output voltage vcom is equal to the reference voltage vctrl, the reference current Ie and the current Is coming from the transistors 1a, 1b of the differential pair 1 are identical.

If the common mode output voltage vcom is greater than the reference voltage, the "pseudo" current mirror tends to revert to an equilibrium state and so that the common mode output voltage vcom is reduced until it reaches and is equal to the reference voltage vctrl.

If the voltage on the gate g2b of the second transistor M2b increases, the current flowing through that transistor M2b is then greater than the current flowing through the second transistor M2a of the first component 3a, the currents flowing through the first transistor M1a of the first component 3a and the first transistor M1b of the second component 3b remaining equal by virtue of their design. The current Is coming from the transistors 1a, 1b of the differential pair 1 increases above the reference current Ie. The current foot bias circuit 3 tends to reduce the output voltages vs1, vs2 simultaneously. Consequently, the common mode output voltage vcom decreases. As the gate voltage of the second transistor M2b of the second component 3b decreases, the current flowing through the latter decreases progressively to a value substantially equal to that of the current flowing through the second transistor M2a of the first component 3a. The current Is coming from the transistors 1a, 1b of the differential pair 1 decreases until it is substantially equal to the reference current Ie.

Similarly, when the common mode output voltage vcom is less than the reference voltage, the "pseudo" current mirror acts in such a way that the common mode output voltage vcom is increased and made equal to the reference voltage vctrl.

The common mode output voltage vcom is therefore regulated to a value equal to the reference voltage vctrl and is not subjected to the variations of the common mode input voltage.

Figure 1:
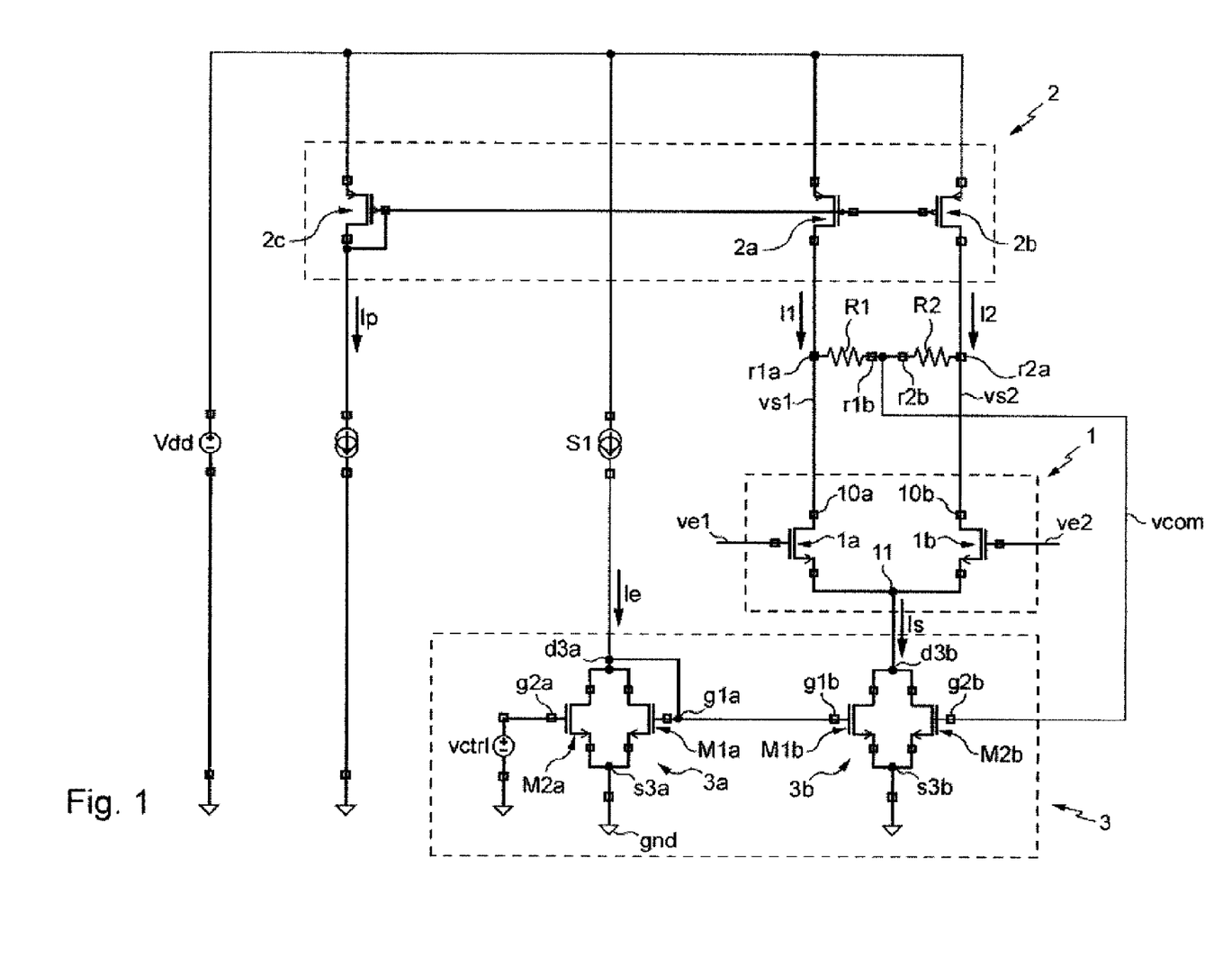
FIG. 1 is an electrical circuit diagram of a completely differential amplifier with common mode feedback according to a first embodiment of the invention.

The FIG. 1 diagram shows a standard current mirror formed by two transistors, the first transistor M1a of the first component 3a and the first transistor M1b of the second component 3b. Here the transistors M1a, M1b are identical in order to reproduce an identical current.

The dimensions of the second transistor M2a of the first component 3a and the second transistor M2b of the second component 3b are calculated so as to arrive at a good compromise between optimum operation of the common mode output voltage vcom feedback system and optimization of the silicon die area.

The dimensions of the two transistors M2a, M2b are therefore preferably greater than those of the first transistors M1a, M1b of each component for the following reasons.

As the reference voltage vctrl increases, the voltage on the gate g1a of the first transistor M1a of the first component 3a falls until it reaches a voltage close to zero. The current mirror formed by the transistors M1a, M1b is then no longer functioning. When this situation occurs, the reference voltage vctrl and the common mode output voltage vcom no longer interact, i.e., the feedback loop ceases to function.

It is therefore necessary to delay the moment at which the gate g1a of the first transistor M1a reaches this loss of synchronization voltage, i.e., to reduce the impact of the reference voltage vctrl on the voltage on the gate g1a of the first transistor. To this end, the length of the gate of the second transistors M2a, M2b can be increased, for example, the source-drain distance under the gate of the transistors M2a, M2b.

The dimensions of the transistors M2a, M2b must nevertheless remain identical in order to maintain the symmetry of the "pseudo" current mirror.

A second embodiment of an amplifier according to the invention including a differential pair 1' with common mode output voltage feedback is described next with reference to FIG. 2.

In this example, the differential pair 1' consists of two double-gate N-channel MOS transistors 1a', 1b'. The transistors 1a', 1b' receive on their gates first and second input voltages ve1, ve2. The voltages present at the drains of the transistors 1a', 1b' respectively correspond to the first and second output voltages vs1 and vs2 of the amplifier.

In this embodiment, the foot bias circuit 3' is a standard bias circuit for a differential pair 1' comprising two single-gate N-channel MOS transistors 3a', 3b'. The sources of the transistors 3a', 3b' are connected to ground. The first transistor 3b' is configured as a diode and receives a bias current. The gates of the transistors 3a', 3b' are connected to each other. Moreover, the drain of the second transistor 3a' is connected to the sources of the transistors of the differential pair 1a', 1b' in order to bias the differential pair 1'.

The common mode output voltage vcom is extracted by means of two resistors R1, R2 in series between the drains of the transistors 1a', 1b'.

The common mode output voltage feedback is effected via the head bias circuit 2' of the differential pair 1'. The feedback is effected by three components 2a', 2b', 2c' connected in a "pseudo" current mirror configuration. A configuration of this kind produces two currents Is' that are identical to a reference current Ie' when the common mode output voltage vcom is equal to a reference voltage vctrl.

In this example, each electronic component 2a', 2b', 2c' consists of two single-gate transistors connected by their drains and their sources. The transistors are P-channel MOS transistors. The sources of the transistors are connected to a supply voltage Vdd. To be more precise, the first component 2a' consists of two transistors M1a', M2a', the second component 2b' of two transistors M1b', M2b', and the third component 2c' of two transistors M1c', M2c'. The first transistor M1a' of the first component 2a' is configured as a diode. The gates g1a', g1b', g1c' of the first transistors M1a', M1b', M1c' are connected to each other.

The first component 2a' of the "pseudo" current mirror is connected to the reference voltage vctrl. To be more precise, the reference voltage vctrl is applied to the gate g2a' of the second transistor M2a' of the first component 2a'.

The second component 2b' and the third component 2c' of the "pseudo" current mirror receive the common mode output voltage vcom. Here the common mode voltage is taken from between the two resistors R1, R2.

The reference current Ie' of the "pseudo" current mirror flows through the first component 2a' of the current mirror. The "pseudo" current mirror produces two identical currents Is' respectively flowing through the second component 2b' and the third component 2c' of the "pseudo" current mirror.

As in the first embodiment described, each of the components 2a', 2b', 2c' of the "pseudo" current mirror consists of two transistors connected in parallel and the operation and the dimensions of the transistors are identical.

In both embodiments, it is possible for some or all of the transistors used in the design of the electronic circuit of a differential pair with common mode output voltage feedback to be multigate transistors and more precisely double-gate transistors. In the present application the expression double-gate transistor means a transistor having a single drain area, a single source area, and two gates that can be biased independently of each other.

Figure 2:
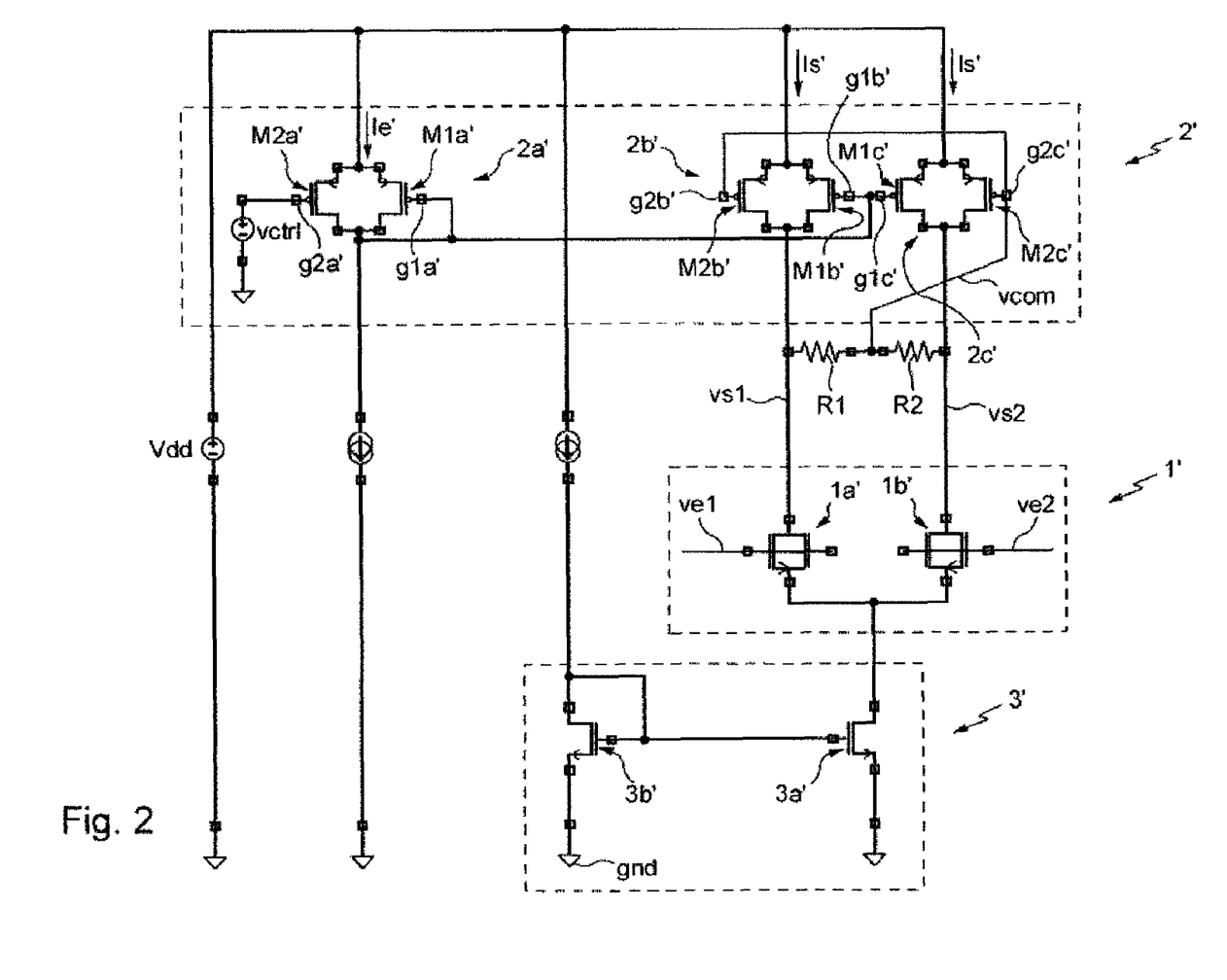
FIG. 2 is an electrical circuit diagram of a completely differential amplifier with common mode feedback according to a second embodiment of the invention.
Figure 3:
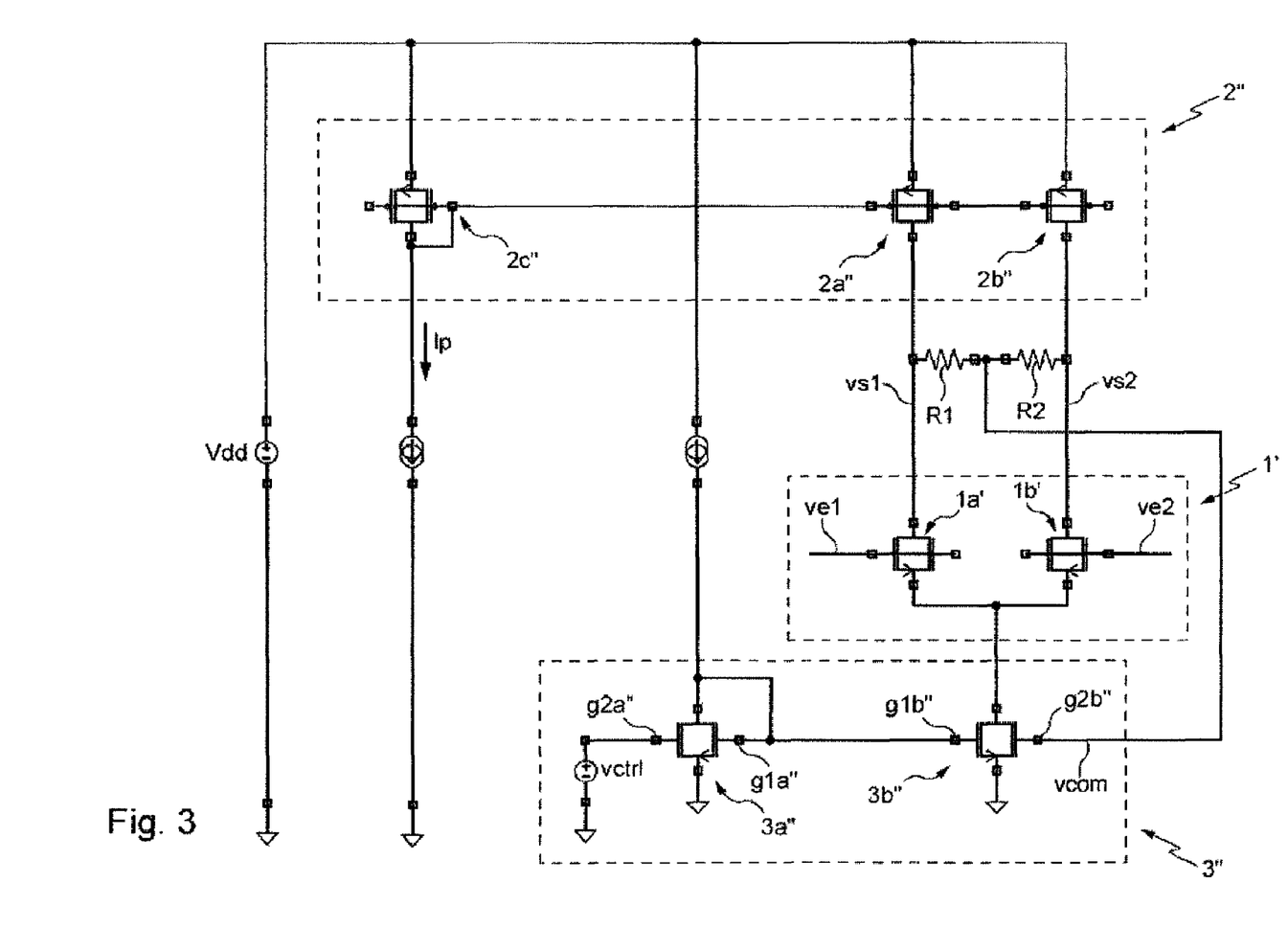
FIG. 3 is an electrical circuit diagram of a completely differential amplifier with common mode feedback according to a third embodiment of the invention.

The amplifier electronic circuit shown in FIG. 3 includes a differential pair 1' with common mode feedback designed with double-gate transistors, like that of the circuit represented in FIG. 2. The operation of this circuit is similar to that described with reference to FIG. 1

The head bias circuit is similar to that of the circuit represented in FIG. 1 except that the single-gate transistors are replaced by double-gate P-channel MOS transistors 2a", 2b", 2c". The sources of the transistors 2a", 2b", 2c" are connected to the supply voltage Vdd. The gates of the transistors 2a", 2b", 2c" are connected to each other. The gates of the first transistor 2c" are connected to the drain of that transistor and to a current source delivering a bias current Ip. The drains of the second and third transistors 2a", 2b" are respectively connected to the drains of the transistors 1a', 1b' of the differential pair 1'.

The common mode output voltage vcom is extracted by means of two resistors R1, R2 in series between the drains of the transistors 1a', 1b' of the differential pair 1'.

The common mode output feedback is effected via the foot bias circuit 3" of the differential pair 1'. The foot bias circuit 3" is similar to the foot bias circuit 3 of the circuit represented in FIG. 1 except that here each component consists of a single double-gate transistor.

The components 3a", 3b" connected in a "pseudo" current mirror configuration therefore each comprise a single double-gate transistor. The sources of the components or transistors 3a", 3b" are connected to ground. The first gate g1a" of the first transistor 3a" is connected to the first gate g1b" of the second transistor 3b". The first gate g1a" of the first transistor 3a" is connected to the drain of that transistor. The second gate g2a" of the first transistor 3a" receives the reference voltage vctrl and the second gate g2b" of the second transistor 3b" receives the common mode output voltage vcom.

It will be noted that, from an electrical point of view, the operation of a double-gate transistor is equivalent to that of two transistors in parallel connected by their sources and by their drains.

The double-gate transistors can be planar double-gate transistors or FinFET transistors, for example.

Using double-gate transistors reduces the silicon die area compared to the use of two transistors in parallel.

Moreover, a double-gate transistor is much less sensitive to the loss of synchronization problem explained hereinabove with reference to FIG. 1. Referring to FIG. 3, the reference voltage vctrl applied to the second gate g2a" of the first transistor 3a" can therefore be made relatively high without the voltage on the first gate g1a" of the first transistor 3a" falling below the loss of synchronization voltage beyond which the pseudo current mirror is no longer functional. Using a double-gate transistor in the head or foot bias circuit implementing the regulation function enables use of the required reference voltage without it being necessary to increase the size of the transistors used in this bias circuit to avoid loss of synchronization problems.

Furthermore, to further reduce the risk of loss of synchronization, asymmetrical double-gate transistors can be used. Such transistors have a first gate with a greater influence than the second gate on conduction of the transistor. The reference voltage vctrl is then applied to the first gate of the asymmetric transistor.

Figure 4:
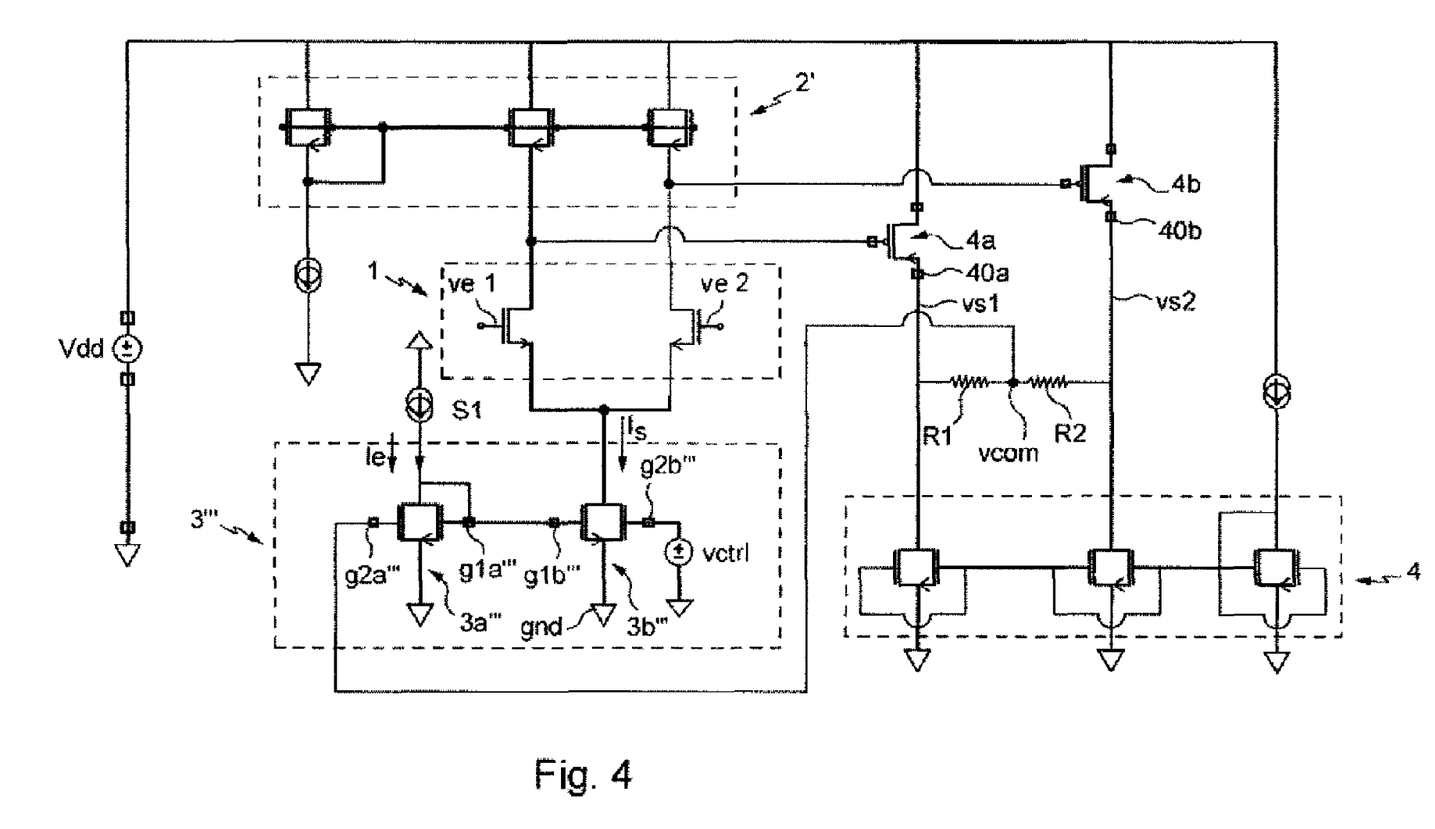
FIG. 4 is an electrical circuit diagram of a completely differential amplifier with common mode feedback according to a fourth embodiment of the invention.

FIG. 4 shows a fourth embodiment of an amplifier according to the invention including a differential pair 1 with common mode feedback. The differential pair 1 is identical to that of the circuit represented in FIG. 1.

In this embodiment, the head bias circuit 2' is identical to that used in the third embodiment, shown in FIG. 3.

Moreover, the amplifier circuit includes a second amplifier stage for increasing the gain of the amplifier circuit. This second stage includes single-gate P-channel MOS transistors 4a, 4b. The sources of the transistors 4a, 4b are connected to the supply voltage Vdd, The transistors 4a, 4b are respectively connected to the drains of the transistors 1a, 1b of the differential pair 1.

A current mirror configuration 4 biases the two transistors 4a, 4b of the second amplifier stage.

In this embodiment, the first output signal vs1 is the voltage on the drain 40a of the first transistor 4a of the second amplifier stage and the second output signal vs2 is the voltage on the drain 40b of the second transistor 4b of the second amplifier stage.

The common mode output voltage vcom is extracted by two resistors R1, R2 in the same way as in the previous embodiments. It will be noted that here extraction is effected in the second amplifier stage.

The common mode feedback is effected via a foot bias circuit 3''' of the differential pair 1. The foot bias circuit 3''' of the differential pair 1 is effected by means of a first electronic component 3a''' and a second electronic component 3b'''.

Here each of the electronic components 3a''', 3b''' connected in a "pseudo" current mirror configuration includes a double-gate N-channel MOS transistor.

The first gate g1a''' of the first transistor or component 3a''' is connected to the first gate g1b''' of the second transistor or component 3b'''. Also, the first gate g1a''' of the first transistor or component 3a''' is connected to the drain of that transistor.

In contrast to the embodiments described hereinabove, the second gate g2a''' of the first transistor or component 3a''' receives the common mode output voltage vcom (and not the reference voltage vctrl) and the second gate g2b''' of the second transistor or component 3b''' receives the reference voltage vctrl (and not the common mode output voltage vcom).

Because of the addition of a new amplifier stage, the gain of the amplifier is negative and it is therefore necessary to reverse the connection of the common mode output voltage and reference voltage to the electronic components 3a''' and 3b''' of the foot bias circuit.

Of course, in this embodiment, it is possible to replace the double-gate transistors with single-gate transistors. Thus all the transistors of the circuit can be transistors with one gate, transistors with multiple gates, or some of each type.

Despite the difference referred to above, the operation of this embodiment, in particular the foot bias circuit formed by the two electronic components connected as a "pseudo" current mirror, is similar to that represented in FIG. 1 and consequently will not be described in detail again.

A fifth embodiment of an amplifier according to the invention including a differential pair 1" with common mode feedback is described next with reference to FIG. 5.

Here the differential pair 1" includes two P-channel MOS transistors 1a", 1b". The sources of the transistors 1a", 1b" are connected to the supply voltage Vdd. The transistors 1a", 1b" receive on their gates input voltages ve1 and ve2, respectively.

The amplifier further includes two transistors 5a, 5b connected in a "cascode" circuit between a head bias circuit 2 and a foot bias circuit 3"". The transistors 5a, 5b are single-gate N-channel MOS transistors. The gates g5a, g5b of the two transistors 5a, 5b are connected to each other. The common gates g5a, g5b receive a bias voltage vcasc, which can be generated by a circuit external to the amplifier circuit or by a component inside the amplifier circuit. For example, the bias voltage vcasc can be generated by means of a system with a current mirror configuration.

The head bias circuit 2 is a standard bias circuit identical to that described for the first embodiment represented in FIG. 1.

The drains d1a", d1b" of the transistors 1a", 1b" of the differential pair 1" are respectively connected to the sources s5a, s5b of the transistors 5a, 5b.

The transistors 5a, 5b connected to the transistors 1a", 1b" of the differential pair 1" produce a low input resistance and consequently a voltage on each of the drains d1a", d1b" that varies little, in contrast to standard differential pairs.

The foot bias circuit 3"" is provided by three double-gate N-channel MOS transistors 3a"", 3b"", 3c"". The sources of the transistors 3a"", 3b"", 3c"" are connected to ground. The first gates g1a"", g1b"", g1c"" of the transistors 3a"", 3b"", 3c"" are connected to each other. The first gate g1a"" of the first transistor 3a"" is connected to its drain. The second gate g2a"" of the first transistor 3a"" receives reference voltage vctrl. The second gates g2b"", g2c"" of the second and third transistors 3b"", 3c"" receive the common mode output voltage vcom.

The first output voltage vs1 of the amplifier is the voltage on the drain d5a of the transistor 5a and the second output voltage vs2 of the amplifier is the voltage on the drain d5b of the transistor 5b.

In this embodiment, the common mode output voltage vcom is extracted by an extractor circuit 6 (shown in FIG. 6) with two inputs and one output. A first input 6a receives the first output voltage vs1 and a second input 6b receives the second output voltage vs2. The output 6c delivers a voltage equal to the common mode output voltage vcom.

The common mode feedback is effected via the foot bias circuit 3" of the differential pair 1" and functions in a similar way to that described for the first embodiment represented in FIG. 1.

Figure 6:
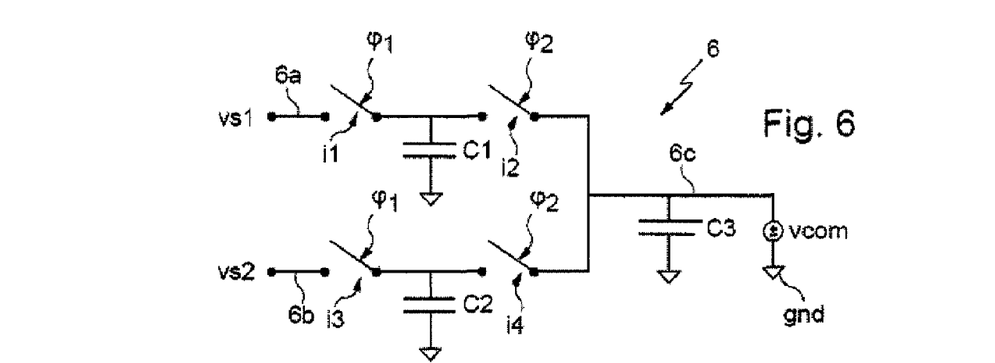
FIG. 6 is an electrical circuit diagram of one embodiment of the extractor circuit of the amplifier represented in FIG. 5.

The extractor circuit 6 represented in FIG. 6 includes three capacitors C1, C2, C3. It also includes four switches i1, i2, i3, i4 activated by two antagonistic or non-overlapping binary activation signals φ1, φ2. The signal φ1 actuates the first switch i1 and the third switch i3. The signal φ2 actuates the second switch i2 and the fourth switch i4.

The first and second switches i1, i2 are placed in series between the first input 6a and the output 6c of the extractor circuit. Similarly, the third and fourth switches i3, i4 are placed in series between the second input 6b and the output 6c of the extractor circuit. The first capacitor C1 is placed between ground and the intermediate node between the first switch i1 and the second switch i2. The second capacitor C2 is placed between ground and the intermediate node between the third switch i3 and the fourth switch i4. The third capacitor C3 is placed between ground and the output 6c of the extractor circuit.

Figure 7:
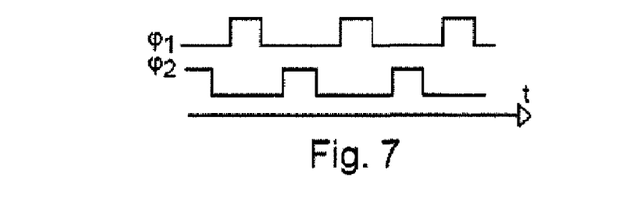
FIG. 7 is an example of timing diagrams of the control signals that can be applied to the extractor circuit represented in FIG. 6.

The signals φ1, φ2 control the common mode extractor circuit in the manner described hereinafter with reference to the timing diagram represented in FIG. 7.

In an initial state, the three capacitors C1, C2, C3 are discharged or precharged to the required reference voltage for the common mode voltage.

When the first signal φ1 is activated (high signal level), it causes the first and third switches i1, i3 to be closed. The signal φ2 is then inactive (low signal level) and the second and fourth switches i2, i4 are open.

Thus the voltage at the terminals of the first capacitor C1 becomes equal to the first output voltage vs1 and the voltage at the terminals of the second capacitor C2 becomes equal to the second output voltage vs2.

The first signal φ1 is then deactivated and during a short time period both signals φ1, φ2 are inactivated (both signals are in the low state).

The second signal φ2 is then activated (high signal level) and the first signal φ1 remains inactive (low signal level). The first and third switches i1, i3 remain open and the second and fourth switches i2, i4 are closed.

A distribution of charges between the first, second and third capacitors C1, C2, C3 therefore takes place.

The first and second signals φ1, φ2 are then inactivated for a short time period.

The sequence described above is then repeated continuously.

The common mode output voltage vcom is therefore proportional to the output voltages vs1, vs2 of the amplifier.

In more concrete terms, the common mode output voltage vcom is calculated from the following equation:

$$vcom = \frac{C1}{C1+C2+C3}vs1 + \frac{C2}{C1+C2+C3}vs2$$

Thus, if the capacitances of the first and second capacitors and the second capacitance have exactly the same value "C1", the common mode output voltage vcom is as follows:

$$vcom = \frac{C1}{2*C1+C3}(vs1+vs2) = \frac{2*C1}{2*C1+C3} \cdot \frac{Vs1+Vs2}{2}$$

Under transient conditions, the voltage at the output 6c of the extractor circuit is in fact proportional to the common mode output voltage. The voltage at the output 6c changes progressively from an initial value, for example zero, to a value equal to the effective common mode voltage of the amplifier.

Under steady state conditions, the voltage at the output 6c of the extractor circuit tracks the variations in the effective common mode output voltage of the amplifier.

Of course, this way of extracting the common mode output voltage can be used in any type of amplifier circuit according to the present invention.

Figure 5:
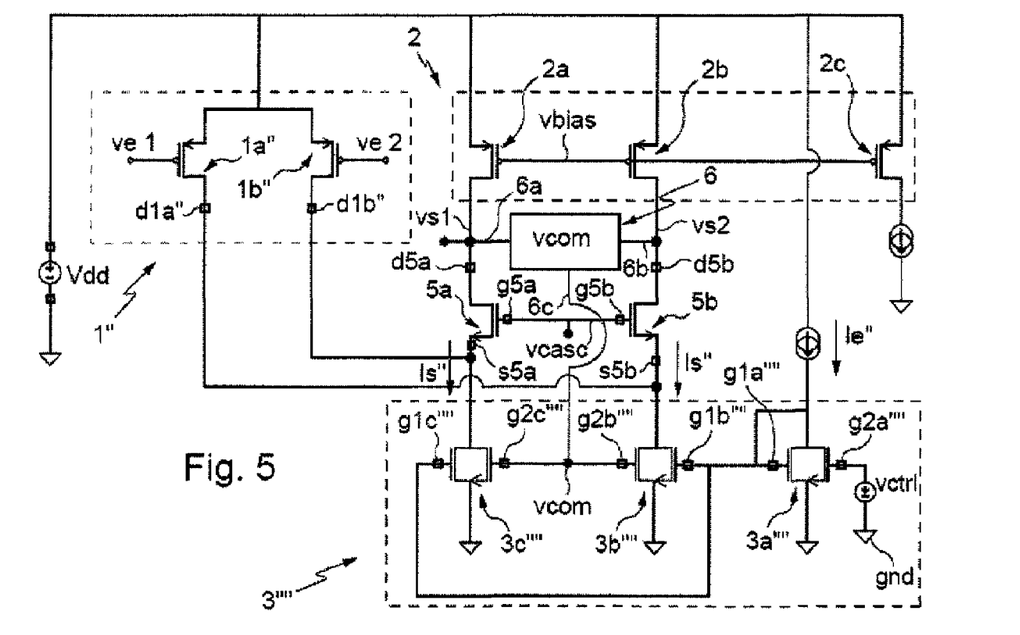
FIG. 5 is an electrical circuit diagram of a completely differential amplifier with common mode feedback according to a fifth embodiment of the invention.

In a different embodiment of the amplifier circuit represented in FIG. 5, the sources of the transistors of the differential pair 1" could be connected to the supply voltage via a head bias circuit identical to the head bias circuit 2 of the amplifier circuit represented in FIG. 1.

In another variant of the FIG. 5 circuit, the foot bias circuit 3"" is replaced by a standard bias circuit, for example of current mirror type, with a predefined fixed current, and between the differential pair 1" and the supply Vdd a head bias circuit 2' identical to that used in the FIG. 2 circuit is inserted. The common mode output feedback is then effected via the head bias circuit of the differential pair 1".

Figure 8:
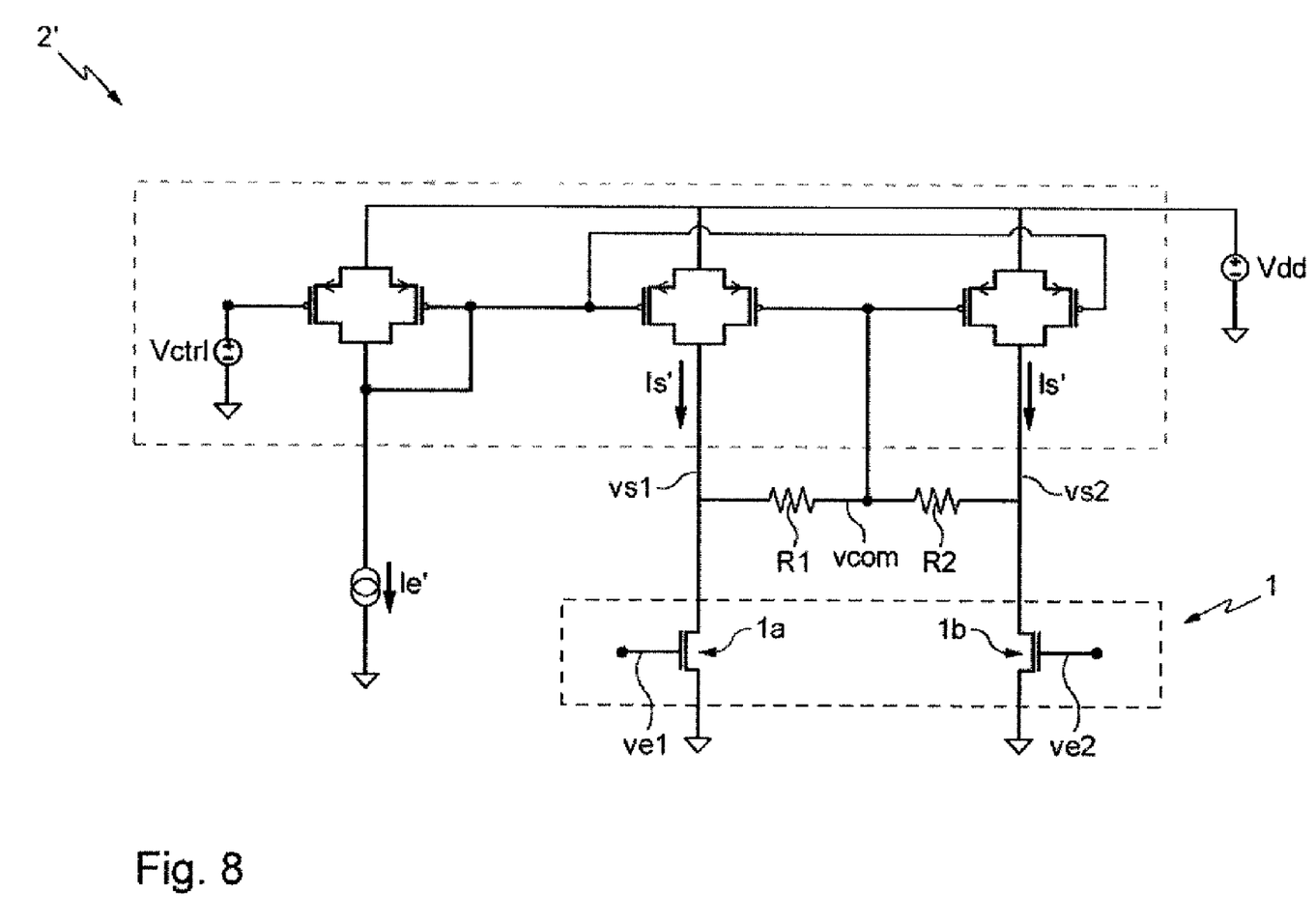
FIG. 8 is an electrical circuit diagram of a completely differential amplifier with common mode feedback according to a sixth embodiment of the invention.

A sixth embodiment of an amplifier according to the invention including a differential pair 1 with common mode feedback is described next with reference to FIG. 8. This embodiment is particularly suitable if the supply voltage Vdd of the amplifier is low, for example less than 1 volt.

The differential pair 1 is identical to that of the circuit represented in FIG. 1. Here the sources of the two transistors 1a, 1b are connected directly to ground. The transistors 1a, 1b receive the input voltages ve1, ve2, respectively. The voltages present at the drains at the transistors 1a, 1b correspond to the first and second output voltages of the amplifier vs1, vs2, respectively.

The differential pair 2 is connected to a head bias circuit 2' identical to that of the circuit represented in FIG. 2. Similarly, the common mode output voltage is extracted by means of two resistors R1, R2 in series between the drains of the transistors 1a, 1b of the differential pair.

In operation, the regulation of the variations in the common mode output voltage can be explained as follows. The transistors of the differential pair 1a, 1b are equivalent to resistors. Thus, if the common mode voltage falls to a value less than the reference voltage vctrl, the current Is' supplied by the bias circuit to each transistor of the differential pair 1a, 1b increases. The output voltages vs1, vs2 increase and consequently the common mode output voltage vcom increases. Conversely, if the common mode output voltage increases to a value greater than the reference voltage vctrl, the current Is' decreases. The output voltages vs1, vs2 decrease and the common mode output voltage vcom decreases.

Thanks to the invention, it is possible to implement a common mode output feedback technique with minimum impact in terms of silicon die area and without increasing current consumption.

The common mode output feedback technique of the invention works with any type of amplifier circuit including one or more amplifier stages. Moreover, the common mode output feedback can be effected in the first amplifier stage or in a subsequent stage. It will be noted, however, that feedback in the first amplifier stage is preferable because it enables "cascode" regulation in all subsequent stages.

It will be noted that, according to the number of amplifier stages and according to the stage at which the feedback is applied, the common mode output voltage is applied in a head or foot bias circuit where the feedback is either to the electronic component of the "pseudo" current mirror that is configured partly as a diode and that receives the reference current (Ie) or to the other electronic component(s) of the "pseudo" current mirror. The person skilled in the art can easily define the place of application of the common mode output voltage as a function of the type of amplifier used.

The present invention also controls the value of the common mode output voltage of the amplifier and reduces the dependency of the latter on variations of other parameters of the circuit.

Of course, numerous modifications can be made to the embodiments described hereinabove without departing from the scope of the invention.

In particular, for designing an amplifier electronic circuit according to the invention, standard single-gate transistors or multiple gate transistors can be used interchangeably.

Of course, some of the transistors of the circuit can be single-gate transistors and others multiple gate transistors.

Thus the electronic components can comprise two transistors connected in parallel or a single double-gate transistor. The operation of two transistors connected in parallel is equivalent to that of a double-gate transistor.

Moreover, the amplifier electronic circuit can comprise more than one amplifier stage.

Furthermore, the amplifier circuits described hereinabove can be implemented in complementary logic by replacing the P-channel MOS transistors with N-channel transistors and vice-versa.

The invention claimed is:

1. An amplifier circuit comprising:
 a first amplifier stage comprising a differential pair, the differential pair comprising a first input transistor controlled by a first input signal and a second input transistor controlled by a second input signal;

means for measuring a common mode output voltage of the amplifier circuit based on first and second output signals of the amplifier circuit;

a first electronic component comprising a first gate, a second gate, a source, and a drain;

a second electronic component comprising a first gate, a second gate, a source, and a drain, the second electronic component configured to bias the first amplifier stage; and wherein:
the first gate of the first electronic component is coupled to the first gate of the second electronic component and the drain of the first electronic component to form a current mirror;

a reference voltage is coupled to one of the second gate of the first electronic component or the second gate of the second electronic component;

the common mode output voltage is coupled to the other of the second gate of the first electronic component or the second gate of the second electronic component that is not coupled to the reference voltage; and whereby a reference current flows through the first electronic component.

2. The amplifier circuit of claim 1, where the second electronic component is coupled to the first and second input transistors.

3. The amplifier circuit of claim 1, further comprising a third electronic component, where a first gate of the third electronic component is coupled to the first gate of the second electronic component, a second gate of the third electronic component is coupled to the second gate of the second electronic component, the second electronic component is coupled to the first input transistor, and the third electronic component is coupled to the second input transistor.

4. The amplifier circuit of claim 1, where the common mode output voltage is coupled to the second gate of the second electronic component, and the reference voltage is coupled to the second gate of the first electronic component.

5. The amplifier circuit of claim 1, where the common mode output voltage is generated by the first and second input transistors.

6. The amplifier circuit of claim 1, further comprising a plurality of amplifier stages, where the second electronic component is configured to bias some or all of the plurality of amplifier stages, the plurality of amplifier stages is odd, and the common mode output voltage is generated by a final amplifier stage of the plurality of amplifier stages.

7. The amplifier circuit of claim 1, where the common mode output voltage is coupled to the second gate of the first electronic component and the reference voltage is coupled to the second gate of the second electronic component.

8. The amplifier circuit of claim 7, further comprising a second amplifier stage comprising transistors, where the differential pair generates a difference between the first and second input signals, the second amplifier stage is coupled to the generated difference, and the common mode output voltage is generated by the transistors in the second amplifier stage.

9. The amplifier circuit of claim 7, further comprising a plurality of amplifier stages, where the second electronic component is configured to bias some or all of the plurality of amplifier stages, the plurality of amplifier stages is even, and the common mode output voltage is generated by a final amplifier stage of the plurality of amplifier stages.

10. The amplifier circuit of claim 1, where at least one of the first and second electronic components comprises single-gate transistors connected in parallel.

11. The amplifier circuit of claim 1, where at least one of the first and second electronic components comprises a double-gate transistor having two gates.

12. The amplifier circuit of claim 1, where at least one of the first and second electronic components comprises a FinFET transistor.

13. The amplifier circuit of claim 1, where the means for measuring the common mode output voltage comprise first and second resistors connected in series between the first and second output signals.

14. The amplifier circuit of claim 1, where the means for measuring the common mode output voltage comprise a plurality of capacitors and a plurality of switches.

* * * * *